(12) United States Patent
Gupta et al.

(10) Patent No.: US 9,871,494 B2
(45) Date of Patent: Jan. 16, 2018

(54) OPERATIONAL AMPLIFIER WITH CLASS AB OUTPUT

(71) Applicant: TEXAS INSTRUMENTS INCORPORATED, Dallas, TX (US)

(72) Inventors: Amit Kumar Gupta, Frisco, TX (US); Peng Cao, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 15/229,756

(22) Filed: Aug. 5, 2016

(65) Prior Publication Data

US 2017/0040963 A1    Feb. 9, 2017

Related U.S. Application Data

(60) Provisional application No. 62/202,606, filed on Aug. 7, 2015.

(51) Int. Cl.
*H03F 3/45* (2006.01)
*H03F 3/21* (2006.01)
*H03F 3/30* (2006.01)

(52) U.S. Cl.
CPC .......... *H03F 3/211* (2013.01); *H03F 3/3022* (2013.01); *H03F 3/45192* (2013.01); *H03F 2203/45288* (2013.01)

(58) Field of Classification Search
CPC .................. H03F 3/45; H03F 2203/45081
USPC ............................................. 330/255, 260
See application file for complete search history.

(56) References Cited

U.S. PATENT DOCUMENTS

| | | | |
|---|---|---|---|
| 6,590,452 B1 * | 7/2003 | van Rhijn | H03F 1/26 330/253 |
| 2002/0109547 A1 * | 8/2002 | Ivanov | H03F 3/3028 330/255 |
| 2004/0008086 A1 * | 1/2004 | Sanchez | H03F 3/45192 330/260 |

* cited by examiner

*Primary Examiner* — Steven J Mottola
(74) *Attorney, Agent, or Firm* — Goutham Kondapalli; Charles A. Brill; Frank D. Cimino

(57) ABSTRACT

An operational amplifier includes an output stage, an input stage, a first auxiliary amplifier, and a second auxiliary amplifier. The output stage includes a first output transistor and a second output transistor. The input stage is configured to drive the output stage. The first auxiliary amplifier is coupled to an output of the input stage and to an input of the first output transistor. The first auxiliary amplifier is configured to bias the first output transistor for class AB operation and to isolate the input stage from a bias voltage applied to the first output transistor. The second auxiliary amplifier is coupled to the output of the input stage and to an input of the second output transistor. The second auxiliary amplifier is configured to bias the second output transistor for class AB operation, and to isolate the input stage from a bias voltage applied to the second output transistor.

18 Claims, 4 Drawing Sheets

OPERATIONAL AMPLIFIER WITH CLASS AB OUTPUT

CROSS-REFERENCE TO RELATED APPLICATIONS

The present application claims priority to U.S. Provisional Patent Application No. 62/202,606, filed Aug. 7, 2015, titled "Novel Class AB Output Biasing Scheme for Operational Amplifier," which is hereby incorporated herein by reference in its entirety.

BACKGROUND

Of the many available electronic devices, operational amplifiers (op-amps) are some of the most widely used. Op-amps are efficient and versatile devices that can be used in a variety of applications, such as signal conditioning, analog instrumentation, analog computation, etc.

An op-amp may employ one of several different circuit arrangements. In one example, a class A amplifier reproduces an entire input signal because an active element of the class A amplifier, such as a transistor, is constantly in the active mode. Class A amplifiers typically have high power consumption because the active element constantly conducts current.

In another example, a class B amplifier typically employs two complementary output transistors, with each output transistor being turned on for half of the time and turned off for the other half of the time. That is, one output transistor operates as a current source, and the other output transistor operates as a current sink. This configuration is sometimes referred to as a "push-pull" configuration since a first branch of the output stage "pushes" or sources currents to a load while a second branch of the output stage "pulls" or sinks current from the load. A class B amplifier has lower power consumption than a class A amplifier but may be susceptible to crossover distortion due to the turn-on of one output transistor not matching the turn-off of the other output transistor.

A class AB amplifier also employs two complementary output transistors (similar to a class B amplifier). Class AB amplifiers avoid the high power consumption of a class A amplifier by always having one output branch substantially turn off when the other output branch is turned on. Although the current in one leg of a class AB amplifier is substantially turned off there is a small amount of current flowing in that leg. The small residual current in the class AB amplifier avoids the crossover distortion produced the turning on and off of the currents in class B amplifiers. Thus class AB amplifiers are able to achieve a relatively high current output while maintaining a low quiescent current. The currents in class AB amplifiers are inversely related such that when one current becomes large, the other current becomes very small.

SUMMARY

Operational amplifiers (op-amps) with class AB output biasing circuitry that increases headroom in a stage preceding the output stage are disclosed herein. In one embodiment, an operational amplifier includes an output stage, an input stage, a first auxiliary amplifier, and a second auxiliary amplifier. The output stage includes a first output transistor and a second output transistor. The input stage is configured to drive the output stage. The first auxiliary amplifier is coupled to an output of the input stage and to an input of the first output transistor. The first auxiliary amplifier is configured to bias the first output transistor for class AB operation and to isolate the input stage from a bias voltage applied to the first output transistor. The second auxiliary amplifier is coupled to the output of the input stage and to an input of the second output transistor. The second auxiliary amplifier is configured to bias the second output transistor for class AB operation, and to isolate the input stage from a bias voltage applied to the second output transistor.

In another embodiment, a multi-stage operational amplifier includes a first stage, a second stage, a first auxiliary amplifier, and a second auxiliary amplifier. The first stage is configured to amplify an input voltage. The second stage is configured to drive an output terminal of the two-stage operational amplifier. The second stage is coupled to an output of the first stage. The first auxiliary amplifier is coupled to the output of the input stage and to a first input of the second stage. The first auxiliary amplifier is configured to generate a first bias voltage and apply the first bias voltage to the second stage for class AB operation. The first auxiliary amplifier also isolates the first stage from the first bias voltage. The second auxiliary amplifier is coupled to the output of the input stage and to a second input of the second stage. The second auxiliary amplifier is configured to generate a second bias voltage and apply the second bias voltage to the second stage for class AB operation. The second auxiliary amplifier also isolates the first stage from the second bias voltage.

In a further embodiment, a class AB output operational amplifier includes an output stage, an input stage, a first auxiliary amplifier, and a second auxiliary amplifier. The output stage includes a high-side output transistor and a low-side output transistor. The input stage is configured to drive the output stage. The first auxiliary amplifier is coupled to an output of the input stage and to an input of the low-side output transistor. The first auxiliary amplifier is configured to bias the low-side output transistor for class AB operation, and to isolate the input stage from a bias voltage applied to the low-side output transistor. The first auxiliary amplifier includes a first transistor and a second transistor coupled as a differential pair. An input terminal of the first transistor is coupled to the output of the input stage. An input terminal of the second transistor is connected to a predetermined DC voltage. The second auxiliary amplifier is coupled to the output of the input stage and an input of the high-side output transistor. The second auxiliary amplifier is configured to bias the high-side output transistor for class AB operation, and to isolate the input stage from a bias voltage applied to the high-side output transistor. The second auxiliary amplifier includes a third transistor and a fourth transistor coupled as a differential pair. An input terminal of the third transistor is coupled to the output of the input stage. An input terminal of the fourth transistor is connected to the predetermined DC voltage. Isolation of the input stage from the output stage by the first auxiliary amplifier and the second auxiliary amplifier provides the input stage with headroom of approximately one-half of the power supply voltage that powers the operational amplifier.

BRIEF DESCRIPTION OF THE DRAWINGS

For a detailed description of various examples, reference will now be made to the accompanying drawings in which.

DETAILED DESCRIPTION

Certain terms are used throughout the following description and claims to refer to particular system components. As one skilled in the art will appreciate, different companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device couples to a second device, that connection may be through a direct connection or through an indirect connection via other devices and connections. The term "approximately" is intended to mean within +1-10% of a stated value.

In class AB operational amplifiers (op-amps), the output transistors are biased such that both transistors conduct around the waveform crossover point, thereby avoiding the crossover distortion characteristic of class B amplifiers. Each of the output transistors will be enabled for more than one half cycle of an input signal, but much less than one full cycle of the input signal. In this way, in a class AB amplifier, each of the push-pull transistors conducts for slightly more than the half cycle of conduction of class B, but much less than the full cycle of conduction of class A. Unfortunately, the bias voltage applied to the output transistors in conventional AB class op-amps tends to reduce the headroom (e.g., output swing) available at the output of the amplifier stage that drives the output transistors. Consequently, the gain of the amplifier stage, and the amount of resistive degeneration that can be used to reduce noise, are limited.

Embodiments of the present disclosure include novel class AB biasing circuitry that increases the headroom available at the output of the amplifier stage that drives the output transistors. The increased headroom allows for higher gain in the amplifier stage and noise reduction due to use of increased resistive degeneration. The AB biasing circuitry disclosed herein also increases the output transconductance of the op-amp, which improves the total harmonic distortion of the op-amp for a given bandwidth and load, and allows for the use of a small isolation resistor when driving a large capacitive load.

Figure 1:
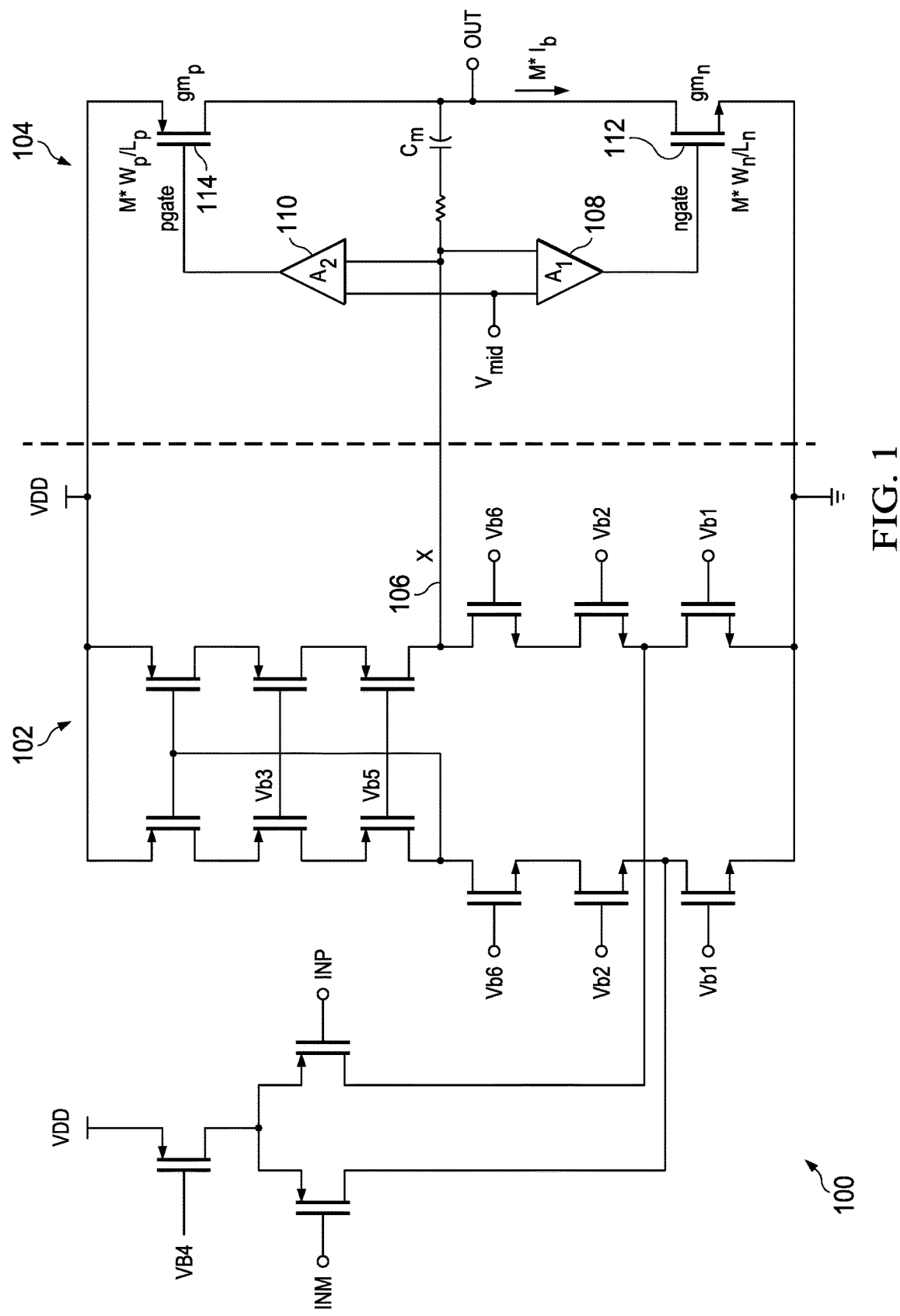
FIG. 1 shows a schematic diagram for a class AB output operational amplifier (op-amp) in accordance with various embodiments.

FIG. 1 shows a schematic diagram for a class AB output operational amplifier (op-amp) 100 in accordance with various embodiments. The op-amp 100 is a two-stage device that includes an input stage 102 and an output stage 104. The input stage 102 is electrically coupled to the output stage 104. In some embodiments, the op-amp 100 may include more than two stages. For example, the input stage 102 may include multiple amplification stages. The input stage 102 receives input signals INP and INM and amplifies the difference of the input signals to produce an output X 106 of the input stage 102. The output X 106 of the input stage 102 is provided to the output stage 104. The input stage 102 may include any number of transistors arranged to form an amplifier. For example, the input stage 102 may include a cascode amplifier made up of two or more stacked transistors.

The output stage 104 includes low side output transistor 112, high side output transistor 114, low-side auxiliary amplifier 108, and high-side auxiliary amplifier 110. The output transistors 112, 114 drive an output terminal of the op-amp 100. The auxiliary amplifiers 108, 110 receive as inputs the output X 106 of the input stage 102 and predetermined voltage $V_{mid}$, which may be equivalent to one-half of the power supply voltage (VDD) that powers the op-amp 100. The auxiliary amplifiers 108, 110 bias the output transistors 112, 114 for class AB operation, and drive the output X 106 of the input stage 102 to $V_{mid}$.

The auxiliary amplifiers 108, 110 isolate the input stage 104 from the class AB bias voltages applied to the output transistors 112, 114. Consequently, the output X 106 is forced to $V_{mid}$ voltage, which can be set to mid-supply, in the auxiliary amplifiers 108, 110. By isolating the input stage 102 from the class AB bias voltage, the input stage 102 is provided with more headroom than is provided in a conventional op-amp that does not isolate the stage driving the output stage from the bias voltage. The term headroom refers to the voltage range over which the output 106 can swing without causing any of the metal oxide semiconductor (MOS) transistors to go into linear region. As a result of the increased headroom, the gain of the input stage 102 can be increased, and increased resistive degeneration applied to provide noise reduction, relative to conventional op-amps.

The auxiliary amplifiers 108, 110 also increase the transconductance of the output stage 104, which in turn improves the total harmonic distortion of the op-amp 100 for a given bandwidth and load. The increased transconductance of the output stage 104 also allows for use of a small isolation resistor when drive large capacitive loads with the op-amp 100.

Figure 2:
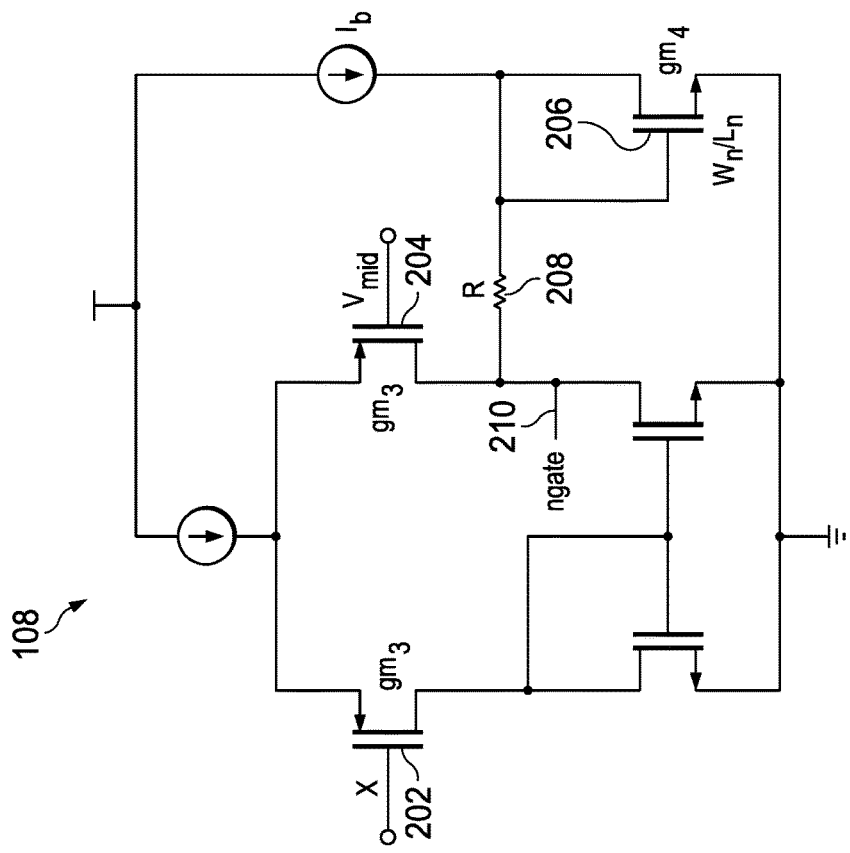
FIG. 2 shows a schematic diagram for a low-side output transistor biasing circuit in accordance with various embodiments.

FIG. 2 shows a schematic diagram for the low side auxiliary amplifier 108 in accordance with various embodiments. The low side auxiliary amplifier 108 includes transistors 202 and 204 arranged as a differential pair. An input terminal (e.g., the gate terminal) of transistor 202 is connected to the output X 106 of the input stage 102. An input terminal (e.g., the gate terminal) of the transistor 204 is connected to the predetermined voltage $V_{mid}$. The low side auxiliary amplifier 108 also includes a transistor 206 that is arranged to operate as a diode and connected to the output terminal 210 of the auxiliary amplifier 108 via a resistor 208. This device 206 is matched to the low-side output device 112 and sets the quiescent current in the output branch of the main amplifier 100. In FIG. 2, the transistor 206 has a width and length of Wn/Ln and is biased with current Ib. The low-side output transistor 112 is scaled by M, resulting on a quiescent output current of M*Ib. The gain ($A_1$) of the low-side auxiliary amplifier 108 may be determined as:

$$A_1 = gm_3 * (R + 1/gm_4)$$

where:
$gm_3$ is the transconductance of transistors 202 and 204;
$gm_4$ is the transconductance of the transistor 206; and
R is the resistance of resistor 208.

Figure 3:
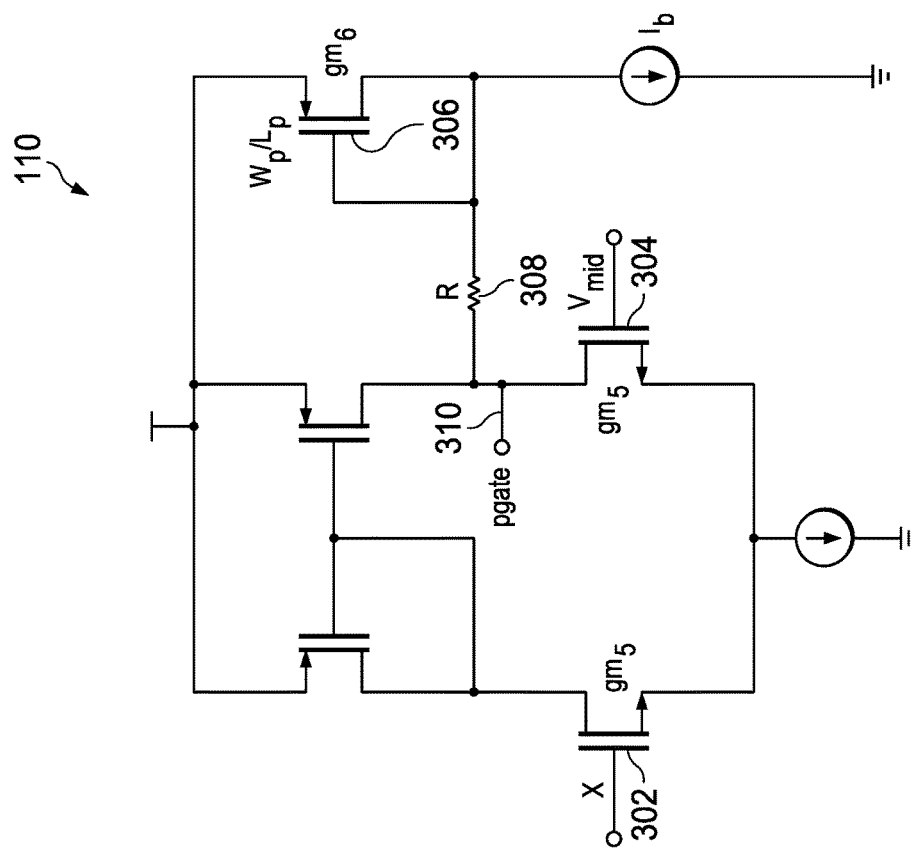
FIG. 3 shows a schematic diagram for a low-side output transistor biasing circuit in accordance with various embodiments.

FIG. 3 shows a schematic diagram for the high-side auxiliary amplifier 110 in accordance with various embodiments. The high-side auxiliary amplifier 110 includes transistors 302 and 304 arranged as a differential pair. An input terminal (e.g., the gate terminal) of transistor 302 is connected to the output X 106 of the input stage 102. An input terminal (e.g., the gate terminal) of the transistor 304 is connected to the predetermined voltage $V_{mid}$. The auxiliary amplifier 110 also includes a transistor 306 that is arranged to operate as a diode and connected to the output terminal 310 of the auxiliary amplifier 110 via a resistor 308. This device 306 is matched to the high-side output device 114 and sets the quiescent current in the output branch of the main amplifier 100. In FIG. 3, the transistor 306 has a width and length of Wn/Ln and is biased with current Ib. The high-side output transistor 114 is scaled by M resulting on a quiescent output current of M*Ib. The gain ($A_2$) of the high side auxiliary amplifier 110 may be determined as:

$$A_2 = gm_5 * (R + 1/gm_6)$$

where:
$gm_5$ is the transconductance of transistors 302 and 304;
$gm_6$ is the transconductance of the transistor 306; and
R is the resistance of resistor 308.

Figure 4:
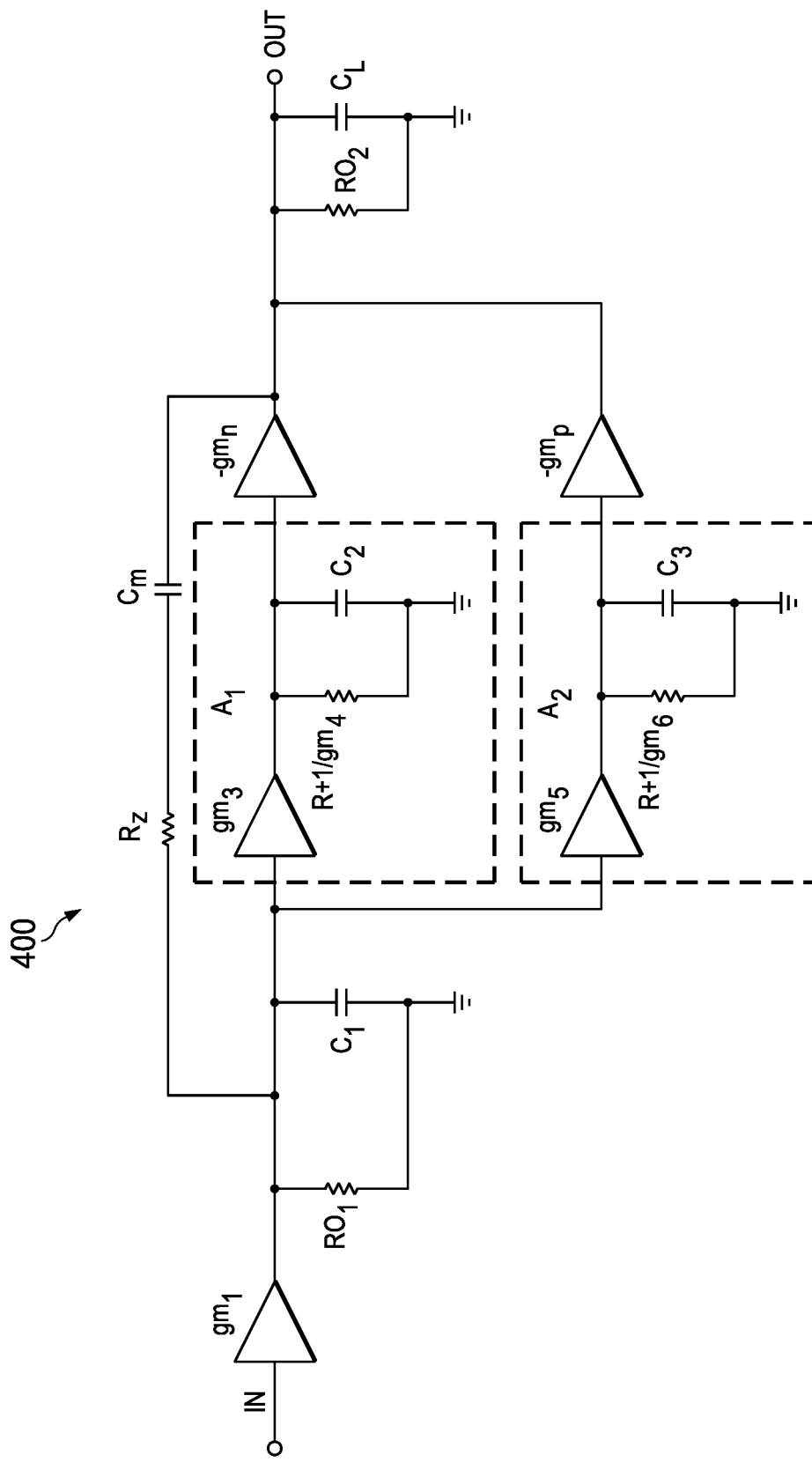
FIG. 4 shows a schematic diagram for compensation of a class AB output op-amp in accordance with various embodiments.

FIG. 4 shows a schematic diagram 400 for a model of the class AB output op-amp 100 in accordance with various embodiments. The model includes two output paths to reflect the two output transistors 112, 114 and the corresponding two auxiliary amplifiers 108, 110. In the model, the transconductance of the output stage 104 may be determined as:

$$gm_o = A_1 * gm_n + A_2 * gm_p$$

where:
$gm_n$ is the transconductance of output transistor 112;
$gm_p$ is the transconductance of output transistor 114; and
$A_1$ and $A_2$, the gains of the auxiliary amplifiers 108, 110, are less than 10.

In some embodiments of the op-amp 100, the gains $A_1$ and $A_2$ may be large. Such embodiments may include nested miller compensation.

Figure 5:
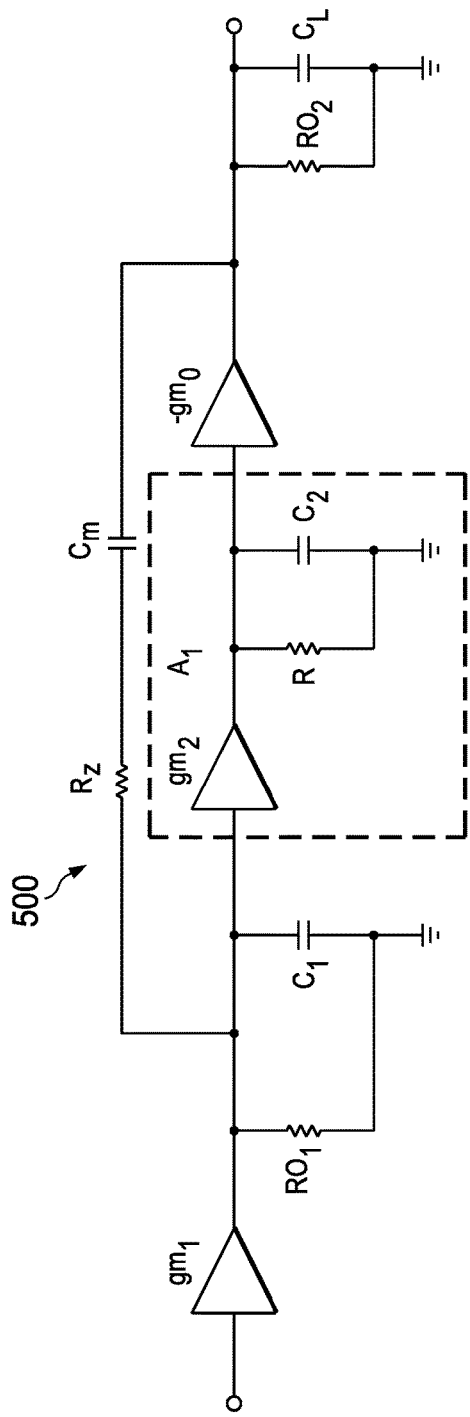
FIGS. 5 and 6 show diagrams of models of a class AB op-amp in accordance with various embodiments used for pole-zero analysis.

FIG. 5 shows a model 500 of the class AB op-amp 100 in accordance with various embodiments for use in pole-zero analysis. The model 500 has been simplified relative to the model 400 by assuming that the two output paths of the model 400 are equivalent and can be merged into a single path. In this model, if $C_2 \gg C_L$, the output pole is real and $p_2 \sim gm_2 * R * gm_o/C_L$. In general, the output pole is a complex conjugate pole pair with pole frequency $\omega_o$ and quality factor Q, where:

$$\omega_o \approx \sqrt{\frac{gm_2 * gm_o}{C_2 * C_L}}, \text{ and}$$

$$Q \approx R * C_2 \sqrt{\frac{gm_2 * gm_o}{C_2 * C_L}}.$$

Figure 6:
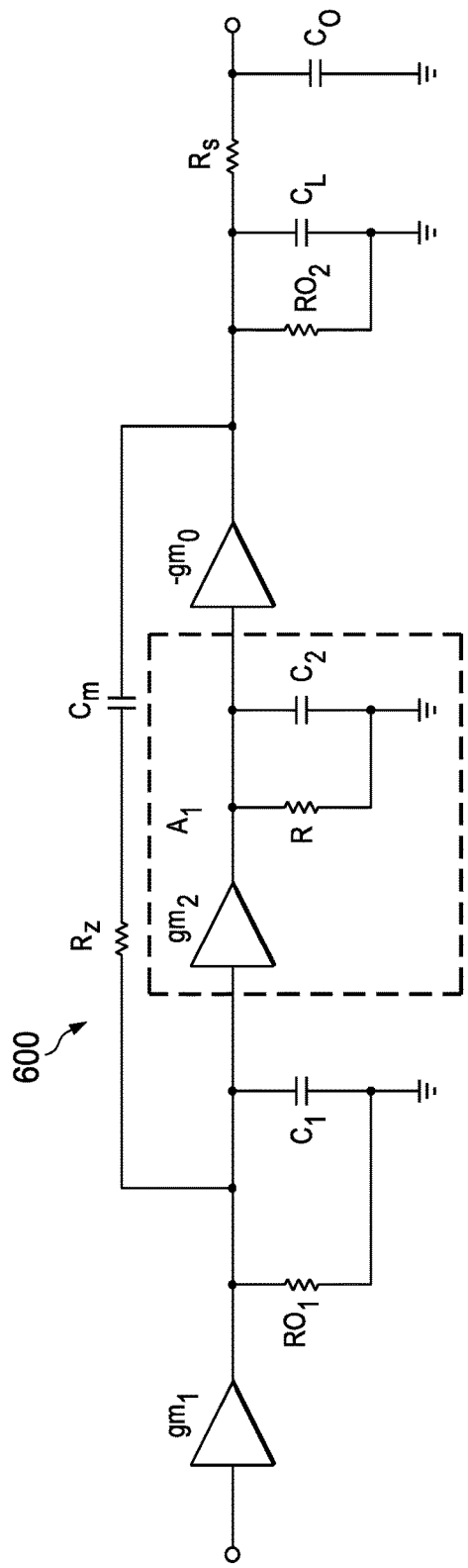

FIG. 6 shows another model 600 of a class AB op-amp in accordance with various embodiments used for pole-zero analysis. The model 600 is similar to the model 500 with an additional resistor $R_S$ and capacitor $C_o$. In the model 600, $C_o \gg C_L$ or $C_2$. $C_o$ may typically be about 10 nano-farads. There is a pole-zero pair in the unity gain bandwidth:

$$\sim 1/(2\pi R_S C_o)$$

There is also a complex conjugate pole pair with frequency $\omega_o$ and quality factor Q.

$$\omega_o \approx \sqrt{\frac{gm_2 * gm_o}{C_2 * C_L} + \frac{1}{R * R_S * C_2 * C_L}}, \text{ and}$$

$$\frac{\omega_o}{Q} \approx \frac{1}{R * C_2} + \frac{1}{R_S * C_L}.$$

While embodiments of the op-amp 100 have been illustrated using metal oxide semiconductor field effect transistors, some embodiments may include bipolar transistors, such as bipolar junction transistors, or other transistors of various technologies to implement the various embodiments of the op-amp 100.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. An operational amplifier, comprising:
an output stage comprising a first output transistor and a second output transistor;
an input stage configured to drive the output stage;
a first auxiliary amplifier coupled to an output of the input stage and an input of the first output transistor, the first auxiliary amplifier configured to bias the first output transistor for class AB operation and to isolate the input stage from a bias voltage applied to the first output transistor, the first auxiliary amplifier comprising a first input transistor and a second input transistor coupled as a differential pair, wherein an input terminal of the first input transistor is coupled to the output of the input stage, and an input terminal of the second input transistor is connected to a predetermined DC voltage; and
a second auxiliary amplifier coupled to the output of the input stage and an input of the second output transistor, the second auxiliary amplifier configured to bias the second output transistor for class AB operation and to isolate the input stage from a bias voltage applied to the second output transistor.

2. The operational amplifier of claim 1, wherein the first auxiliary amplifier further comprises a third input transistor configured as a diode, wherein the third input transistor is coupled to a reference voltage and coupled, via a resistor, to an output of the first auxiliary amplifier, to set a quiescent output current of the first output transistor.

3. The operational amplifier of claim 2, wherein the first auxiliary amplifier provides gain as a function of a transconductance of the first input transistor, a transconductance of the second input transistor, and a sum of resistance of the resistor and reciprocal of transconductance of the third input transistor.

4. The operational amplifier of claim 1, wherein the second auxiliary amplifier comprises a first input transistor and a second input transistor coupled as a differential pair, wherein an input terminal of the first input transistor is coupled to the output of the input stage, and an input terminal of the second input transistor is connected to a predetermined DC voltage.

5. The operational amplifier of claim 4, wherein the second auxiliary amplifier further comprises a third input transistor configured as a diode, wherein the third input transistor is coupled to a power supply voltage and coupled, via a resistor, to an output of the second auxiliary amplifier, to set a quiescent output current of the second output transistor.

6. The operational amplifier of claim 5, wherein the first auxiliary amplifier provides gain as a function of transconductance of the first input transistor and the second input transistor, and a sum of resistance of the resistor and reciprocal of transconductance of the third input transistor.

7. The operational amplifier of claim 1, wherein transconductance of the output stage is approximately a sum of:
  a product of gain of the first auxiliary amplifier and transconductance of the first output transistor; and
  a product of gain of the second auxiliary amplifier and transconductance of the second output transistor.

8. The operational amplifier of claim 7, wherein the gain of the first auxiliary amplifier is less than ten and the gain of the second auxiliary amplifier is less than ten.

9. The operational amplifier of claim 1, wherein headroom of the first stage is approximately one-half of the power supply voltage that provides supply voltage to the operational amplifier.

10. A multi-stage operational amplifier, comprising:
  a first stage configured to amplify an input voltage;
  a second stage configured to drive an output terminal of the multi-stage operational amplifier, wherein the second stage is coupled to an output of the first stage;
  a first auxiliary amplifier coupled to the output of the input stage and to a first input of the second stage, the first auxiliary amplifier configured to:
    generate a first bias voltage and apply the first bias voltage to the second stage for class AB operation; and
    isolate the first stage from the first bias voltage; and
  a second auxiliary amplifier coupled to the output of the input stage and to a second input of the second stage, the second auxiliary amplifier configured to:
    generate a second bias voltage and apply the second bias voltage to the second stage for class AB operation; and
    isolate the first stage from the second bias voltage,
  wherein each of the first auxiliary amplifier and the second auxiliary amplifier comprises a first input transistor and a second input transistor coupled as a differential pair, and wherein in each of the first auxiliary amplifier and the second auxiliary amplifier an input terminal of the first input transistor is coupled to the output of the first stage, and an input terminal of the second input transistor is connected to a predetermined DC voltage.

11. The multi-stage operational amplifier of claim 10, wherein:
  the first auxiliary amplifier further comprises a third input transistor configured as a diode, wherein the third input transistor is coupled to a reference voltage and coupled, via a resistor, to an output of the first auxiliary amplifier; and
  the second auxiliary amplifier further comprises a fourth input transistor configured as a diode, wherein the fourth input transistor is coupled to a power supply voltage and coupled, via a resistor, to an output of the second auxiliary amplifier.

12. The multi-stage operational amplifier of claim 11, wherein a gain of each of the first auxiliary amplifier and the second auxiliary amplifier is a function of transconductance of the first input transistor and the second input transistor and a sum of resistance of the resistor and reciprocal of transconductance of one of the third input transistor or the fourth input transistor.

13. The multi-stage operational amplifier of claim 10, wherein transconductance of the second stage is approximately a sum of:
  a product of gain of the first auxiliary amplifier and transconductance of a low-side output transistor; and
  a product of gain of the second auxiliary amplifier and transconductance of a high-side output transistor.

14. The multi-stage operational amplifier of claim 13, wherein the gain of the first auxiliary amplifier is less than ten and the gain of the second auxiliary amplifier is less than ten.

15. The multi-stage operational amplifier of claim 10, wherein the first auxiliary amplifier and the second auxiliary amplifier provide headroom in the first stage of approximately one-half of the power supply voltage that provides supply voltage to the multi-stage operational amplifier.

16. A class AB output operational amplifier, comprising:
  an output stage comprising a high-side output transistor and a low-side output transistor;
  an input stage configured to drive the output stage;
  a first auxiliary amplifier coupled to an output of the input stage and an input of the low-side output transistor, the first auxiliary amplifier configured to bias the low-side output transistor for class AB operation and to isolate the input stage from a bias voltage applied to the low-side output transistor, the first auxiliary amplifier comprising:
    a first transistor and a second transistor coupled as a differential pair, wherein an input terminal of the first transistor is coupled to the output of the input stage, and an input terminal of the second transistor is connected to a predetermined DC voltage; and
  a second auxiliary amplifier coupled to the output of the input stage and an input of the high-side output transistor, the second auxiliary amplifier configured to bias the high-side output transistor for class AB operation and to isolate the input stage from a bias voltage applied to the high-side output transistor, the second auxiliary amplifier comprising:
    a third transistor and a fourth transistor coupled as a differential pair, wherein an input terminal of the third transistor is coupled to the output of the input stage, and an input terminal of the fourth transistor is connected to the predetermined DC voltage,
  wherein isolation of the input stage from the output stage by the first auxiliary amplifier and the second auxiliary amplifier provides the input stage with headroom of approximately one-half of the power supply voltage that provides supply voltage to the operational amplifier.

17. The class AB output operational amplifier of claim 16, wherein:
  the first auxiliary amplifier further comprises a fifth transistor configured as a diode, wherein the fifth transistor is coupled to a reference voltage and coupled, via a first resistor, to an output of the first auxiliary amplifier;
  the first auxiliary amplifier provides gain as a function of transconductance of the first transistor and the second transistor, and a sum of resistance of the first resistor and reciprocal of transconductance of the fifth transistor;
  the second auxiliary amplifier comprises a sixth transistor configured as a diode, wherein the sixth transistor is coupled to a power supply voltage and coupled, via a second resistor, to an output of the second auxiliary amplifier; and the second auxiliary amplifier provides gain as a function of transconductance of the third transistor and the fourth transistor, and a sum of resistance of the second resistor and reciprocal of transconductance of the sixth transistor.

18. The class AB output operational amplifier of claim 17, wherein transconductance of the output stage is approximately a sum of:

a product of gain of the first auxiliary amplifier and transconductance of the low-side output transistor; and a product of gain of the second auxiliary amplifier and transconductance of the high-side output transistor.

* * * * *